United States Patent [19]
Ashby et al.

[11] Patent Number: 5,356,516
[45] Date of Patent: Oct. 18, 1994

[54] PROCESS FOR ETCHING MIXED METAL OXIDES

[75] Inventors: Carol I. H. Ashby, Edgewood, N. Mex.; David S. Ginley, Evergreen, Colo.

[73] Assignee: Sandia Corporation, Albuquerque, N. Mex.

[21] Appl. No.: 23,286

[22] Filed: Feb. 26, 1993

[51] Int. Cl.$^5$ .................................................. C23F 1/00
[52] U.S. Cl. .................................. 156/667; 156/633; 156/634; 156/637
[58] Field of Search ............... 156/633, 634, 637, 667, 156/664

[56] References Cited

U.S. PATENT DOCUMENTS

| | | | |
|---|---|---|---|
| 3,887,403 | 6/1975 | Cogsins | 156/7 |
| 4,759,823 | 7/1988 | Asselanis | 156/659.1 |
| 4,997,522 | 3/1991 | Shokoohi | 156/659.1 |
| 5,106,454 | 4/1992 | Allardyce | 156/629 |

OTHER PUBLICATIONS

Shokoohi, Schiavone, Rogers, Inam, Wu, Nazar and Venkatesan, "Wet Chemical etching of high Tc superconductors by EDTA" pp. 1299–1302.

Mat. Res. Soc. Symp. Proc. vol. 169 1990 Materials Research Society "Improved Aqueous Etchant for High Tc Superconductor Materials", Ashby et al. Appl. Phys. Lett. 60(17), 27 Apr. 1992 2147–2149.

"Machining of PZT, PT and $(Mn,Zn)Fe_2O_4$ Ceramics by Laser—Induced Chemical Etching" Tadashi Shiosaki, Japanese Journal of Applied Physics, vol. 26 (1987) Supplement 26-2, pp. 159–161.

*Primary Examiner*—R. Bruce Breneman
*Assistant Examiner*—Joni Chang
*Attorney, Agent, or Firm*—Gregory A. Cone

[57] ABSTRACT

An etching process using dicarboxylic and tricarboxylic acids as chelating etchants for mixed metal oxide films such as high temperature superconductors and ferroelectric materials. Undesirable differential etching rates between different metal oxides are avoided by selection of the proper acid or combination of acids. Feature sizes below one micron, excellent quality vertical edges, and film thicknesses in the 100 Angstom range may be achieved by this method.

18 Claims, 1 Drawing Sheet

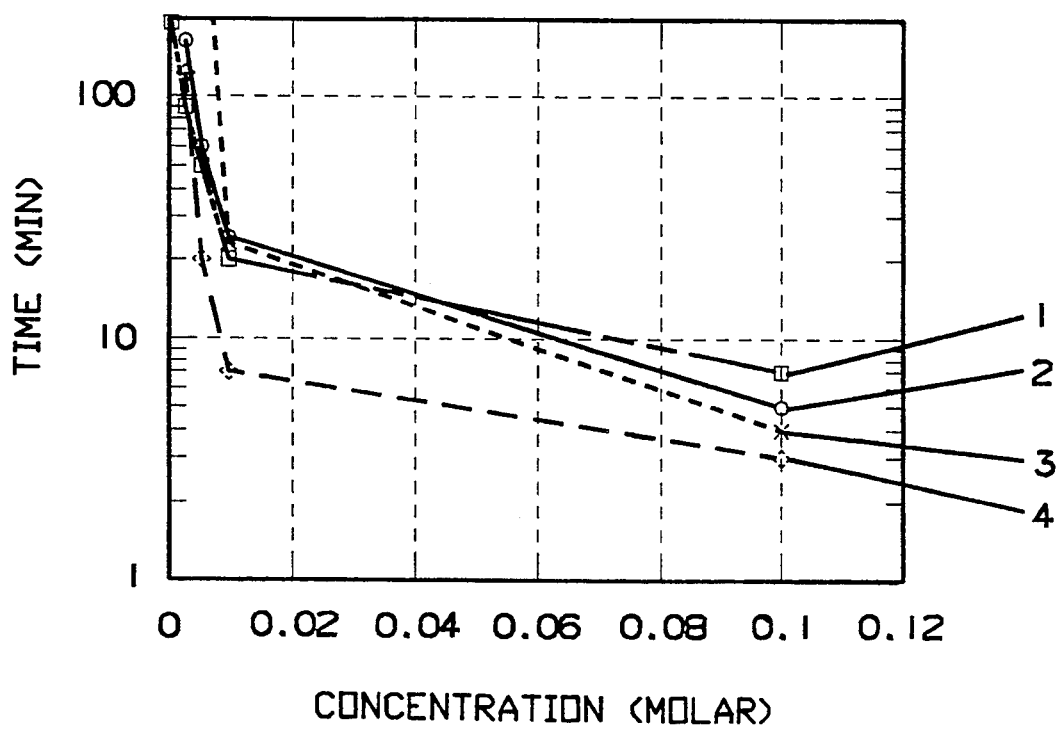

PROCESS FOR ETCHING MIXED METAL OXIDES

BACKGROUND OF THE INVENTION

The government has rights in this invention pursuant to Contract No. DE-AC04-76DP00789 awarded by the Department of Energy.

This invention relates to etching methods useful in microelectronic processes. More particularly this invention relates to aqueous acidic solutions useful in etching mixed metal oxides.

A key enabling technology in the application of oxide-based thin films for microelectronic applications is the development of etching processes that do not deleteriously affect the sample surface and allow feature sizes suitable for the intended applications. It is critically important for most applications that the stoichiometry of the surface remain essentially the same as the composition of the bulk material. Changes in stoichiometry can significantly affect electrical, optical, and mechanical properties. A prime example of the need for retention of surface stoichiometry during processing is provided by the high-Tc oxide superconductors (HTS), where surface stoichiometry changes can seriously degrade critical electronic properties such as high frequency surface resistance. Low surface resistance is crucially important for high-speed digital and microwave HTS device operation. Such devices also require micron and submicron-sized features to achieve device speeds in excess of 100 GHz. fabrication of these feature sizes requires well controlled etching in terms of rate, edge profile, and surface stoichiometry.

Retention of surface stoichiometry is also important for ferroelectrics such as PZT (Lead zirconium titanate) and PLZT (lead lanthanum zirconium titanate). For example, the ability to couple into the high-dielectric-constant ferroelectric can be decreased if composition changes reduce the dielectric constant at the surface. Additionally, changes in stoichiometry before firing can prevent formation of the necessary perovskite structure during firing. Stoichiometry changes can also affect the adherence of electrodes. Unfortunately, many etchants can preferentially remove one metal species relative to another. Consequently, the ability to retain original stoichiometry during etching can be a critical process requirement when etching patterns into mixed metal oxides. It would also be desirable to be able to selectively etch certain oxide species from those in a mixture or layered structure.

The main technique currently employed for oxide materials is reactive ion etching or ion milling. These approaches employ very expensive equipment, require significant environmental and health safeguards, and cannot be adjusted to selectively etch certain oxides. The most common chemical alternative etching process for HTS materials employs bromine dissolved in alcohol to produce etched features without deleterious changes in surface stoichiometry of the HTS. These etches are potentially unstable (explosive events have been reported) and present significant environmental and health hazards. The alcoholic solvents employed prevent the use of positive photoresist processing for pattern fabrication. This restricts the size of features that this Br/alcohol process can produce to greater than 2 micrometers. This is too large to permit fabrication of very high speed devices and circuits in HTS thin films, since feature sizes on the order of 1 micrometer or less are required for >50 GHz operation.

It has been previously demonstrated that aqueous solutions of chelating etchants can produce very good post-etching surface properties in oxide superconductors if the appropriate conditions are maintained during etching using an EDTA solution (ethylenediaminetetracetic acid)(Ashby, Martens, Plut, Ginley, and Phillips, Appl. Phys. Lett. 60 (17), 2147 (1992)). The new process disclosed herein provides both a greater degree of control over surface stoichiometry by allowing judicious selection of the appropriate combination of chelating properties of the specific etchants employed and a wider process window due to reduced sensitivity to solution pH. With the previous EDTA-based process, the metal-ion selectivity is completely determined by the affinity of EDTA for the different meals, since EDTA is the only chelating species in solution. In contrast, this new dicarboxylic/tricarboxylic (DCA/TCA) process permits one to select the individual chelating acids and the most appropriate combinations thereof to tailor the metal-ion selectivity. This gives the person employing this process the ability to control the post-etch surface stoichiometry by his/her selection of acids rather than being restricted by the characteristics of a single chelating agent such as EDTA.

With the EDTA-based etchants used in previous work, the investigators found a pronounced dependence of etching behavior and post-etch surface properties on solution pH. The EDTA-based process previously developed produces optimum etching in terms of both useful etch rates and good surface properties when the pH is carefully controlled to produce the bidentate diprotonated $H_2EDTA^{2-}$ as the dominant solution species. The tetradentate $EDTA^{4-}$ does not etch at appreciable rates. This results from its ability to bind simultaneously to adjacent surface metal ions, thereby passivating the surface against ready dissolution. The solution with predominantly the nonchelating, monodentate $H_3EDTA$-produces greater surface resistance degradation.

These results clearly indicate the importance of both a chelating etchant and a ligand structure that does not permit significant bridging with adjacent metal ions. With EDTA as the etchant, careful control of pH is required to retain the bidentate $H_2EDTA^{2-}$ as the predominant solution species; deviation from optimal pH range significantly degrades surface quality or excessively decreases etch rate. The EDTA etches also were critically dependent on the stirring of the etch solution. Without sufficient agitation, poor surface quality was obtained.

Our new etching process uses dicarboxylic and/or tricarboxylic (DCA/TCA) acids as bidentate or tridentate chelating ligands that do not require as restrictive a range of operating pH as EDTA to chelate with a single surface metal atom. The decreased sensitivity of the dominant solution species to solution pH provides a broader process window and greater process reproducibility for both etch rate and surface property retention. Additionally, the requirement of bidenticity that is important for the EDTA-based process is relaxed for those tridentate ligands, such as citric acid, that are structurally restricted from binding to adjacent metal atoms. We also found that the DCA/TCA etches require less stirring, and in some cases no agitation is required.

SUMMARY OF THE INVENTION

This process uses chelating polycarboxylic acids to etch mixed metal oxides in a tailorable manner that can preserve surface stoichiometry while permitting very small feature sizes and excellent edge control. It can also selectively etch certain oxide species within a mixture. Dicarboxylic and tricarboxylic acids, singly or in combination, are tailored to the particular mixed metal oxide to optimize the process. Some mixed metal oxides are initially resistant to the aqueous polycarboxylic acid alone, and it is useful in these cases to use a small concentration of a mineral acid to activate the process. It is also desirable to prevent the formation of carbonates in the etching solution by bubbling nitrogen gas through it. This also deoxygenates the solution, further reducing possibility of surface oxidation during etching.

BRIEF DESCRIPTION OF THE DRAWING

The drawing figure is a graph of the etch rates for different concentrations of three different carboxylic acids in two species of high temperature superconductors as a function of time.

DETAILED DESCRIPTION OF THE INVENTION

The process of this invention is based on a novel concept of using organic acids with multiple carboxylate moieties (i.e., portions of molecules having a chemical characteristic with the general formula [$RCO_2$]-) to coordinate metal cations on the surface of the material to be etched. The chelation (a chemical process involving the formation of a heterocyclic ring compound that contains at least one metal cation in the ring) rapidly captures the metal ions before deleterious surface reactions can take place. In addition, through the appropriate selection of the organic acid(s), the rate constant can be tuned for a specific metal or metals, making the etch slective for a particular layer of a heterostructure.

Modeling of the process has identified a number of key parameters for the acids that determines the efficiency and selectivity of the etch. First is the number of carboxylate groups which controls the number of bonds to the metal, three is normally preferred. Second is the separation of the carboxylates by the hydrocarbon backbone. This controls the abilility of the acid to coordinate metal ions and thus controls the equilibruim constant for the coordination and consequently the etch efficiency. Third is the pH dependence of the dissociation constant for the acid. This is because the concentration of the acid controls the dissociation of the carboxylates and hence determines the rate of the etch.

The efficiency and quality of the etch can be controlled by regulating the solution pH, degassing to eliminate $CO_2$, and/or $O_2$, and/or using an activating agent such as very dilute HF to facilitate the dissolution process if necessary.

It is important to emphasize the advantages provided by the selectivity made possible by the use of this process. Many of the desired microelectronic sturcutes are mulitlayered. Some may be metal oxide/semiconductor/metal heterostructures, while others will have multiple metal oxide layers with different compositions in each oxide layer. The ability to tailor the etch by choosing appropriate carboxylic acids is unique to this invention and allows tuning to etch a particular layer. For example, in ferroelectric memory structures a typical structure is $PZT/RuO_2/TiO_2$. For device processing it is desirable to be able to selectively etch each layer independently of the others.

The etching process uses chelating dicarboxylic (DCA), tricarboxylic (TCA) and combinations thereof in aqueous solutions acting as bidentate or tridentate chelating ligands. The acids are employed singly or in combination based on their abilities to coordinate the various heavy metal ions in the oxide to be etched. The basic approach is to ensure that the effective rates of complexation for all of the ions are comparable and large, resulting in an effective rate of removal of the target oxide surface without deleterious changes in its stoichiometry. Although some mixed-metal oxides may retain their surface stoichiometry during etching with a solution containing a single DCA or TCA, the greater affinity and soluablizing ability of a single DCA or TCA for one of the metal ions can lead to significant stoichiometry changes.

Deleterious changes in surface stoichiometry can be avoided using our process. One either selects a single DCA or TCA that does not preferentially dissolve one of the metal ions, or one selects a combination of DCA's or TCA's that individually exhibit different affinities for different metal ions but in combination result in uniform removal of all the metal ions comprising the mixed-metal oxide.

Additionally, for those materials such as HTS films that are susceptible to surface-degrading reaction of all or some of their surface metal ions with dissolved carbon dioxide, the etching and rinse solutions employed in our process are decarbonated by bubbling nitrogen gas throught the solutions before and during exposure of the thin films to these solutions. In this manner the creation of the undesirable insoluble or slightly soluble metal carbonates is prevented. This portion of our process also deoxygenates the solutions, thereby reducing the possiblity of deleterious surface composition changes that might result form surface oxidation.

Many of the mixed-metal oxides (i.e., the HTS materials) are thermodynamically unstable enough in aqueous media that no additional driving force is required for etching; for some oxides additional stimulus may be required. Typically this would be an addition of HF or related mineral acid, but still relying on the chelating agent to determine surface quality.

The appropriate chelating acid or mixture of acids employed in our process is determined by the particular mixed-metal oxide film and by whether one wishes to retain original surface stoichiometry or to controllably alter it. The use of combinations of different carboxylic acids that have different chelate ring sizes of different affinities for different metal ions permits selection of combinations of different acids at appropriate concentrations to insure that the surface stoichiometry of a particular mixed metal oxide will not change appreciably during etching, if such stoichiometric stability is desired.

It should be noted that it is possible to intentionally alter the stoichiometry with these etches. If selective surface composition changes are desired, our process can employ single DCAs or TCAs or combinations thereof that will produce the desired composition change. For example, selective ion etching can be useful in preparing a surface for deposition of another layer in a heterostructure stack. This will provide a better contact or better match for the growth of the next layer.

Factors that are considered in selecting a preferred DCA/TCA or combination of the same are the affinity of the metal ions for carboxylate-type ligands, the ionic radius of the metal, and the chelate ring size formed by the metal ion and the DCA or TCA. In general, the most appropriate chelating etchant to be used in our process is a dicarboxylic or tricarboxylic acid in solution at a pH that deprotonates the carboxylate functionalities (determining this relies on knowing the equilibrium constants for chelating as a function of pH and is well within the ordinary skill in this art). Metal ions bond much more strongly to deprotonated sites.

Additionally, these chelating acids are selected to produce relatively small chelated ring structures with metal ions. This is to avoid significant bridging between adjacent or nearly adjacent metal atoms on the surface. Such bridging can retard etching unacceptably. Very small chelate ring sizes favor preferential removal of small metal ions, as seen in the preferential near-total loss of Cu from $YBa_2Cu_3O_{7-x}$ when exposed to oxalic acid solutions (R. P. Vasquez, M. C. Foote, and B. D. Hunt, Appl. Phys. Lett. 55, 1801–3 (1989). This is highly undesirable for HTS thin films because the superconductivity of the surface is lost due to the gross stoichiometric change. This preferential etching of Cu can be prevented using our process by adding appropriate concentrations of a DCA or TCA that form larger chelate rings and favors removal of the larger Y and Ba ions. The geometry of the acid pocket that traps the metal ion is a function of the structure of the organic backbone of the acid and is determined by the length of the chain between the carboxylates and the degree of branching.

Examples of appropriate acids include but are not restricted to DCAs such as malonic, succinic, glutaric, adipic, tartaric, maleic, and phthalic acids. For some mixed-metal oxides, tridentate chelating ligands, such as citric acid, that are not readily able to bridge adjacent metal surface atoms can be employed in our process. Tartaric acid (2,3-dihydroxybutanedioic acid, HO2CCH(OH)CH(OH)CO2H), and citric acid (2-hydroxy-1,2,3, propanetricarboxylic acid, HOC(CH2HO2H)-2CO2H) contain additional oxygen functionalities that may facilitate dissolution of their complexes with surface metal ions.

Alternatively, one might want to selectively remove a particular metal species to produce a desired change in surface composition and properties. It may be highly useful to prepare a single DCA or TCA or a mixture of such acids with a higher affinity for a particular metal or with higher complex solubility.

We have applied our process to the etching of $YBa_2Cu_3O_{7-x}$ (Y prefixes in Table 1) and $Tl_2Ba_2Ca_2Cu_3O_x$ (T prefixes in Table 1) using oxalic, malonic, succinic, adipic, tartaric, and citric acids. However, our process is not restricted to the use of these acids; other dicarboxylic, tricarboxylic, and possible other polycarboxylic acids with appropriate chelating behavior can also be used. The following Table 1 includes quantitative information on high-frequency (94 GHz) surface resistance (m-ohms) for these materials before and after etching with different carboxylic acids, with and without a nitrogen gas purge step.

TABLE I

| SAMPLE | ACID | PURGE | Rs (before) | Rs (after) | % CHANGE |
|---|---|---|---|---|---|
| YS1 | citric | No | 37.8 | 46.6 | 23.3 |
| YD1 | citric | No | 40.5 | 50.5 | 24.7 |
| YS2 | adipic | No | 37.8 | 47.1 | 24.6 |
| YD2 | adipic | No | 40.4 | 50.9 | 26.0 |
| YS3 | oxalic | No | 38.0 | 61.2 | 61.1 |
| YD3 | oxalic | No | 40.4 | 67.0 | 65.8 |
| YS4 | adipic | Yes | 37.9 | 40.6 | 7.1 |
| YD4 | adipic | Yes | 40.4 | 43.8 | 8.4 |
| YS5 | citric | Yes | 37.9 | 40.2 | 6.1 |
| YD5 | citric | Yes | 40.5 | 43.1 | 6.4 |
| YS6 | oxalic | Yes | 38.0 | 54.1 | 42.4 |
| YD6 | oxalic | Yes | 40.3 | 58.4 | 44.9 |
| T54-1 | critic | Yes | 94.8 | 103.4 | 9.1 |
| T54-4 | oxalic | Yes | 91.9 | 127.1 | 38.3 |
| T54-5 | adipic | Yes | 86.5 | 96.5 | 11.6 |

TABLE 2

| Acid | Succinic | Oxalic | Malonic | Citric | Adipic | Tartaric |
|---|---|---|---|---|---|---|
| YBCO (500Å) | | | | | | |
| Etch Thru Time (min) | 2 | 3 | 5 | 5 | 8 | 1.5 |
| Edge Profile | | sloped | | vertical | vertical | |
| TBCCO (3000Å) | | | | | | |
| Etch Thru Time (min) | 9 | 16 | 11 | 17 | 14 | 8 |
| Edge Profile | sloped | vertical | sloped | vertical | vertical | rough |
| Acid (pH) | | | | | | |
| without purge | | 2.15 | | 2.51 | 3.17 | |
| with purge | | 2.2 | | 2.63 | 3.3 | |

Some of the preceding acids and combinations thereof exhibit nearly vertical etch profiles using our process, an indication of edge sharpness is given in Table 2. This is illustrated by several preferred embodiments of our invention employing citric and adipic acids as the principal etchant. The use of these acids to produce vertical edge profiles with our process can be especially important for high-speed and high-frequency HTS device. While it is generally desirable to have vertical edge profiles, there are device applications where it is desirable to have other, generally sloped profiles. Selection of an appropriate acid or combination of acids can control the edge profile. The drawing figure shows the dependence of etch rate on the concentration of various acids. Above 0.01 molar etch rates are reproducible and rates change predictably. In the figure, the curve marked with the numeral 1 represents etch rate for 4-based HTS in citric acid; the numeral 2 represents Tl-based HTS in oxalic acid; the numeral 3 represents Tl-based HTS in adipic acid; and the numeral 4 represents Tl-based HTS in citric acid.

The excellent selectivity of this process was demonstrated in an experiment in which we utilized an aqueous solution of 0.5% HF with 0.05 to 0.1M adipic or citric acid to remove a 4000 angstrom layer of PZT selectively from an underlying 1000 angstrom layer of $RuO_2$ with feature sizes compatible with submicron lithography.

We claim:

1. A process for controllably etching at least one of the metal oxides from a mixed metal oxide surface comprising contacting the surface with an aqueous solution of at least one chelating poly-carboxylic acid selected from the group consisting of bicarboxylic acids and tricarboxylic acids.

2. The process of claim 1 wherein the aqueous solution further contains a mineral acid in a concentration sufficient to act as an activating agent.

3. The process of claim 1 wherein the mixed metal oxide is a high temperature superconductor material.

4. The process of claim 1 wherein the mixed metal oxide is a ferroelectric material.

5. The process of claim 1 wherein the aqueous solution is treated with a deoxygenating agent.

6. The process of claim 5 wherein the agent is nitrogen gas.

7. The process of claim 1 wherein the at least one chelating carboxylic acid is selected from the group consisting of dicarboxylic acids, tricarboxylic acids, and combinations thereof.

8. The process of claim 1 wherein the at least one acid is selected from the group consisting of malonic acid, succinic acid, glutaric acid, adipic acid, tartaric acid, maleic acid, phthalic acid, oxalic acid, citric acid, and combinations thereof.

9. The process of claim 4 wherein the ferroelectric material is selected from the group consisting of PZT and PLZT compounds.

10. The process of claim 9 wherein the at least one acid is selected from the group consisting of citric acid, adipic acid, and combinations thereof.

11. The process of claim 10 wherein the concentration of the at least one acid is greater than about 0.01M.

12. The process of claim 3 wherein the high temperature superconductor is selected from the group consisting of $YBa_2Cu_3O_7$ and $Tl_2Ca_2Ba_2Cu_3O_{10}$.

13. The process of claim 12 wherein the concentration of the at least one acid is greater than about 0.01M.

14. The process of claim 1 wherein the rate of the etching is controlled by adjusting the pH of the solution.

15. The process of claim 1 wherein the aqueous solution is treated with a decarbonating agent.

16. A process for controllably etching at least one of the metal oxides from a ferroelectric material selected from the group consisting of PZT and PLZT compounds comprising contacting the surface of the material with an aqueous solution of at least one chelating poly-carboxylic acid.

17. The process of claim 16 wherein the at least one acid is selected from the group consisting of citric acid, adipic acid, and combinations thereof.

18. The process of claim 17 wherein the concentration of the at least one acid is greater than about 0.01M.

* * * * *